United States Patent
Mochizuki et al.

(10) Patent No.: US 7,429,723 B2
(45) Date of Patent: Sep. 30, 2008

(54) CONVERSION APPARATUS, RADIATION DETECTION APPARATUS, AND RADIATION DETECTION SYSTEM

(75) Inventors: Chiori Mochizuki, Sagamihara (JP); Keiichi Nomura, Honjo (JP); Minoru Watanabe, Honjo (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 280 days.

(21) Appl. No.: 11/456,155

(22) Filed: Jul. 7, 2006

(65) Prior Publication Data

US 2007/0007458 A1  Jan. 11, 2007

(30) Foreign Application Priority Data

Jul. 11, 2005 (JP) ............... 2005-201603
Jun. 30, 2006 (JP) ............... 2006-181890

(51) Int. Cl.
- G01T 1/24 (2006.01)
- H05G 1/64 (2006.01)
- H01L 27/146 (2006.01)
- H01L 25/00 (2006.01)
- H01L 27/00 (2006.01)

(52) U.S. Cl. ............... 250/208.1; 250/370.09; 250/370.14; 250/338.4; 257/E27.14; 378/98.8

(58) Field of Classification Search ............... 250/208.1, 250/370.08, 370.09, 370.11, 370.14, 338.4; 257/59, 72, E27.14, E29.151; 378/98.8
See application file for complete search history.

(56) References Cited

U.S. PATENT DOCUMENTS

| | | | |
|---|---|---|---|
| 6,354,595 B1 | 3/2002 | Vieux et al. | |
| 6,881,945 B2* | 4/2005 | Ishii et al. | 250/208.1 |
| 6,989,540 B2* | 1/2006 | Morii et al. | 250/370.11 |
| 7,148,487 B2* | 12/2006 | Ishii et al. | 250/370.14 |
| 7,205,568 B2* | 4/2007 | Watanabe et al. | 257/59 |
| 2003/0226974 A1 | 12/2003 | Nomura et al. | |
| 2004/0041097 A1* | 3/2004 | Ishii et al. | 250/370.07 |
| 2005/0259168 A1* | 11/2005 | Kameshima et al. | 348/303 |
| 2007/0007458 A1* | 1/2007 | Mochizuki et al. | 250/370.09 |

FOREIGN PATENT DOCUMENTS

| | | |
|---|---|---|
| JP | 06-160877 A | 6/1994 |
| JP | 07-183324 A | 7/1995 |
| JP | 2003-319270 A | 11/2003 |
| JP | 2004-0150002 A | 1/2004 |
| WO | 98/32179 | 7/1998 |

* cited by examiner

*Primary Examiner*—John R Lee
(74) *Attorney, Agent, or Firm*—Canon U.S.A., Inc. I.P. Division

(57) ABSTRACT

A conversion apparatus includes pixels including switching elements provided on an insulating substrate and conversion elements disposed over the switching elements and connected to the switching elements. Conductive lines are coupled to the pixels and have terminal elements for providing a connection to an external circuit. The terminal elements are disposed in a metal layer that is formed over the conversion elements. The conversion apparatus further includes a transparent conductive layer covering surfaces of the terminal elements, and a protective layer covering edges of the terminal elements and having openings.

16 Claims, 7 Drawing Sheets

CONVERSION APPARATUS, RADIATION DETECTION APPARATUS, AND RADIATION DETECTION SYSTEM

BACKGROUND OF THE INVENTION

1. Field of the Invention

The present invention relates to photoelectric conversion substrates, photoelectric conversion apparatuses, radiation detection substrates, and radiation detection apparatuses for use in medical diagnostic imaging apparatuses, non-destructive inspection apparatuses, analysis apparatuses using radiation, and the like. In this specification, radiation includes electromagnetic waves like visible light, X-rays, α-rays, β-rays, γ-rays, etc.

2. Description of the Related Art

In general, conventional medical diagnostic imaging can be classified into two types: general imaging for obtaining still images, such as X-ray images, and fluoroscopic imaging for obtaining dynamic images. The type of imaging and an imaging apparatus to be used are selected as necessary.

In conventional general imaging, two methods described below are mainly used. One of the two methods is a screen-film imaging (hereafter abbreviated as SF imaging) method in which imaging is performed by film exposure, development, and fixing using a screen film obtained by combining a fluorescent plate and a film. The other method is a computed radiography imaging (hereafter abbreviated as CR imaging) method in which a radiographic image is recorded on a photostimulable phosphor plate as a latent image. Optical information corresponding to the latent image is output by scanning the photostimulable phosphor plate with a laser, and the output optical information is read out with a sensor. However, general imaging has a problem in that processes for obtaining the radiographic image are complex. In addition, although it is possible to convert the obtained radiographic image into digital data, the radiographic image is secondarily digitized in such a case and it takes a long time to obtain a digitized radiographic image.

In conventional fluoroscopic imaging, an image intensifier imaging (hereafter abbreviated as I.I. imaging) method using a fluorescent material and an electron tube is mainly used. However, conventional fluoroscopic imaging has a problem in that the size of the device is large since the electron tube is used. In addition, since the electron tube is used, view area (detection area) is small and it is difficult to obtain an image of a large area. In addition, there is also a problem that the resolution of the obtained image is low since the electron tube is used.

Accordingly, sensor panels in which pixels including conversion elements for converting radiation or light from a fluorescent material into electric charges and switching elements are arranged on a substrate in a two-dimensional matrix pattern have recently been attracting attention. In particular, flat panel detectors (hereafter abbreviated as FPD) in which pixels having conversion elements constructed of non-single crystal semiconductor, such as amorphous silicon (hereafter abbreviated as a-Si), and thin-film transistors (hereafter abbreviated as TFT) constructed of non-single crystal semiconductor are arranged on an insulating substrate in a two-dimensional matrix pattern have been attracting attention.

In the FPD, radiation having image information is converted into electric charges by the conversion elements, and the thus obtained electric charges are read out by the switching elements, so that electrical signals based on the image information can be obtained. Accordingly, the image information can be obtained directly from the FPD as digital signal information, and the image data can be easily stored, processed, transmitted, etc. Therefore, application of the radiographic image information can be increased. Although the characteristics, such as sensitivity, of the FPD can vary depending on imaging conditions, it is confirmed that the level of the characteristics of the FPD is the same as or higher than those of the SF imaging method and the CR imaging method. In addition, since the electrical signals representing the image information can be obtained directly from the FPD, the time required for obtaining an image can be reduced compared to those in the SF imaging method and the CR imaging method.

As an example of a FPD, a PIN-FPD including a sensor panel in which pixels including PIN photodiodes made of a-Si and TFTs are arranged in a two-dimensional matrix pattern is known. The PIN-FPD has a laminated structure in which a layer forming the PIN photodiodes is laminated on a layer forming the TFTs on a substrate. In addition, a MIS-FPD including a sensor panel in which pixels including MIS photosensors made of a-Si and TFTs are arranged in a two-dimensional matrix pattern is also known. The MIS-FPD has a planar structure in which the MIS photosensors are formed in the same layer as a layer forming the TFTs on a substrate. In addition, a MIS-FPD having a laminated structure in which a layer forming the MIS photosensors is laminated on a layer forming the TFTs on a substrate is also disclosed in, for example, U.S. Patent Application Publication No. 2003/0226974.

As an example of a FPD, the above-mentioned FPD discussed in U.S. Patent Application Publication No. 2003/0226974 will be explained below. Here, a structure in which pixels are arranged in a 3-by-3 matrix pattern will be described for simplicity.

FIG. 6 is a schematic equivalent circuit diagram illustrating an equivalent circuit of the conventional FPD discussed in U.S. Patent Application Publication No. 2003/0226974. FIG. 7 is a schematic plan view of a single pixel included in the conventional FPD discussed in U.S. Patent Application Publication No. 2003/0226974. FIG. 8 is a schematic sectional view of FIG. 7 taken along line VIII-VIII.

Light emitted from a wavelength converter in accordance with radiation incident thereon is converted into signal electric charges at each of a plurality of photoelectric conversion elements to which a bias voltage for photoelectric conversion is applied. A plurality of switching elements perform a transmission operation in accordance with drive signals applied to drive lines 103 by a drive circuit 107, and the signal electric charges obtained by the photoelectric conversion elements 101 are read out in parallel by a signal-processing circuit 106 via signal lines 104. The signal electric charges read out in parallel are converted into a serial signal by the signal-processing circuit 106, and the thus obtained serial signal is converted from analog to digital by an analog-to-digital (A/D) converter 108 and is then output. Accordingly, an image signal for a single image corresponding to the incident radiation that represents image information can be obtained.

In the above-described radiation detection apparatus using the FPD, the drive lines 103 are connected to the drive circuit 107 for applying the drive signals to gate electrodes of the switching elements 102 arranged in the row direction. In addition, the signal lines 104 are connected to the signal-processing circuit 106 for processing the signal electric charges generated by the photoelectric conversion elements 101 and transmitted from source or drain electrodes of the switching elements 102 arranged in the column direction. In addition, bias lines 105 are connected to a bias power source 109 having a first voltage for causing the photoelectric conversion elements 101 to perform photoelectric conversion and a second voltage for applying a bias for setting the photoelectric conversion elements 101 to an initial state. The electrical connections between the lines and the external circuits are provided by terminal elements provided on the lines at one end thereof. For example, terminal elements included in a radiation detection apparatus using a FPD discussed in Japanese Patent Laid-Open No. 2003-319270 will be described below.

A protective layer that covers the photoelectric conversion elements and the switching elements is removed in the entire area outside the pixel area so as to form a connection area (open area), and the terminal elements are connected to respective integrated circuits (ICs) in the contact area.

As described in, for example, International Patent Application Publication No. WO98/32179, in the radiation detection apparatus to which the ICs are connected, each of the ICs on an insulating substrate is covered by a sealing member (not shown) and is protected from the outside.

However, in the above-described radiation detection apparatus using the FPD, there is a possibility that corrosion of the terminal elements will occur. More specifically, since the protective layer is removed in the entire connection area and the terminal elements are not covered, the terminal elements are easily contaminated by moisture and impurities in the atmosphere. As discussed in International Patent Application Publication No. WO98/32179, each of the terminal elements is covered by a sealing member.

However, moisture and impurities from an interface between the sealing member and the insulating substrate cannot be blocked sufficiently. Therefore, contamination by moisture and impurities at side faces of each terminal element and an interface between the terminal element and the insulating substrate cannot be suppressed sufficiently. In particular, in a radiation detection apparatus used for medical inspections, there is a possibility that rubbing alcohol, moisture, etc., will directly come into contact with the radiation detection apparatus. Accordingly, countermeasures for such a situation are demanded.

In addition, since the protective layer is removed in the entire connection area and the terminal elements are not covered, if conductive adhesive enters a gap between the adjacent terminal elements, there is a possibility that a short circuit will occur between the adjacent terminal elements. In such a case, a desired drive operation cannot be performed and an image cannot be obtained. Thus, there is a risk that reliability and manufacturing yield will be reduced.

SUMMARY OF THE INVENTION

Embodiments of the present invention are directed to a conversion apparatus and a radiation detection apparatus that can reliably prevent contamination by moisture and impurities from side faces of each terminal element and an interface between the terminal element and an insulating substrate.

According to an embodiment of the present invention, a conversion apparatus includes pixels, terminal elements and conductive lines coupled between the pixels and the terminal elements. The pixels include switching elements coupled to conversion elements. The switching elements are disposed over an insulating substrate and the conversion elements are disposed over the switching elements. The conversion apparatus further includes a transparent conductive layer covering surfaces of the terminal elements and a protective layer covering edges of the terminal elements and having openings. The lines include bias lines disposed over the conversion elements and coupled to an external power source circuit for applying a bias voltage to the conversion elements. The terminal elements to provide connections to an external circuit are disposed in a metal layer that is formed over the conversion elements.

According to another embodiment of the present invention, a radiation detection apparatus includes pixels having switching elements coupled to conversion elements, terminal elements to provide connections to an external circuit, and conductive lines coupled between the pixels and the terminal elements. The lines include bias lines coupled between the conversion elements and an external power source circuit to apply a bias voltage to the conversion elements. Terminal elements are disposed in a layer that is formed over a layer including the conversion elements. The radiation detection apparatus further includes a wavelength converter disposed over the conversion elements for converting incident radiation into visible light.

According to the embodiments of the present invention, contamination by moisture and impurities from side faces of each terminal element and the interface between the terminal element and the insulating substrate can be reliably prevented. In addition, the adjacent terminal elements can be reliably insulated from each other. Therefore, reduction in reliability and manufacturing yield can be prevented.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of exemplary embodiments of the invention.

DESCRIPTION OF THE EMBODIMENTS

Embodiments of the present invention will be described below with reference to the accompanying drawings.

First Exemplary Embodiment

Figure 1:
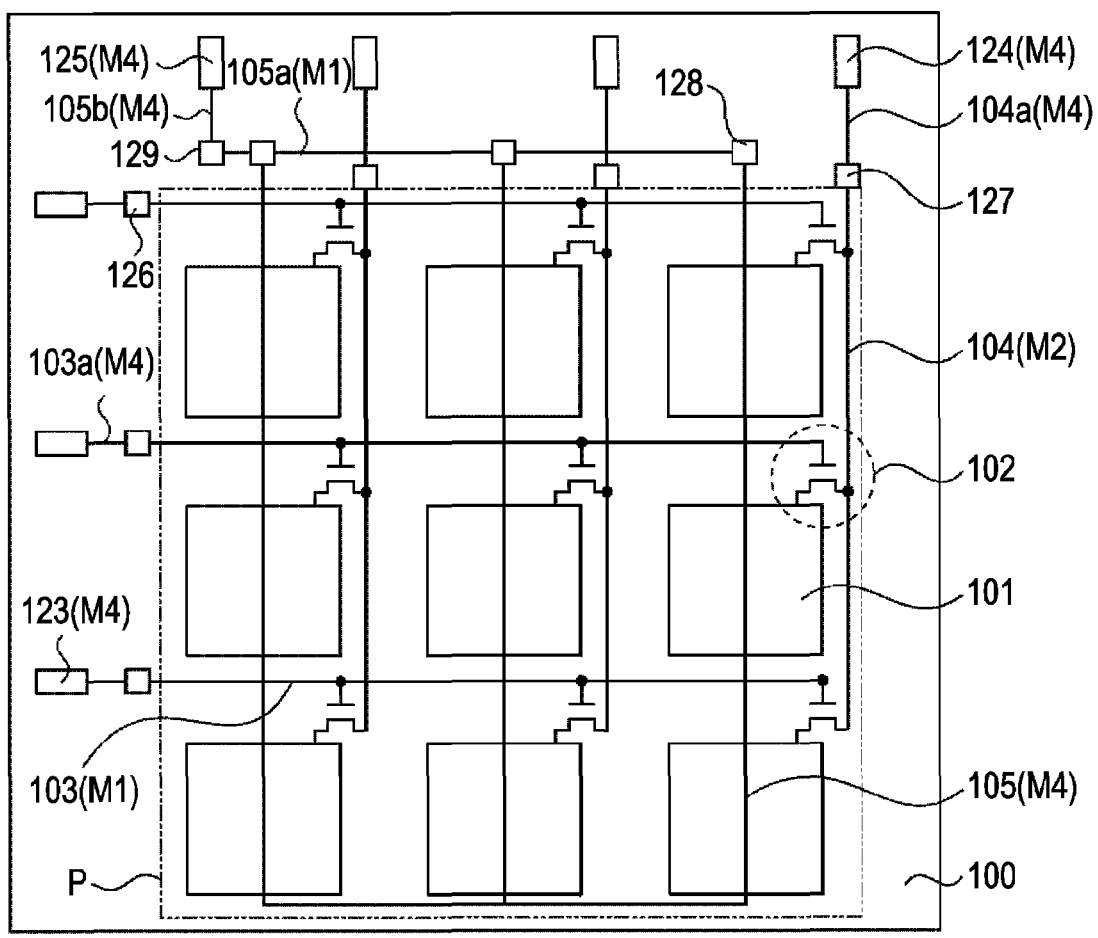
FIG. 1 is a schematic circuit diagram of a photoelectric conversion apparatus and a radiation detection apparatus according to a first embodiment of the present invention.
Figure 2:
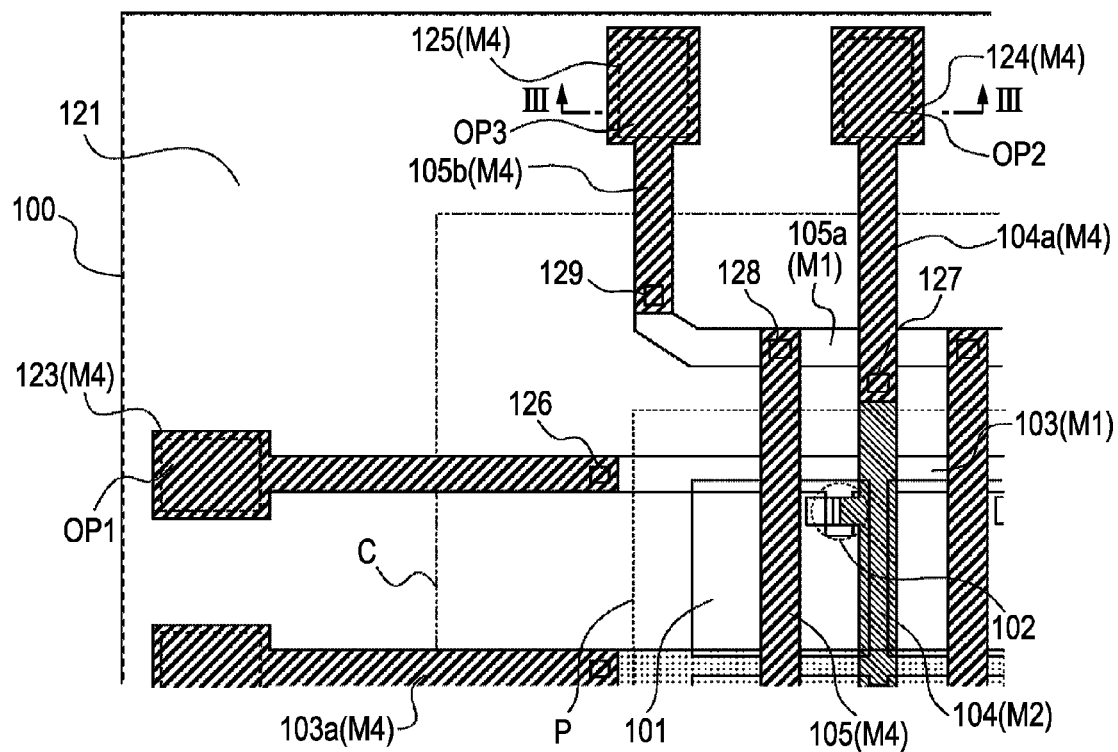
FIG. 2 is a plan view in which a part of the photoelectric conversion apparatus and the radiation detection apparatus according to the first embodiment of the present invention is enlarged.
Figure 3:
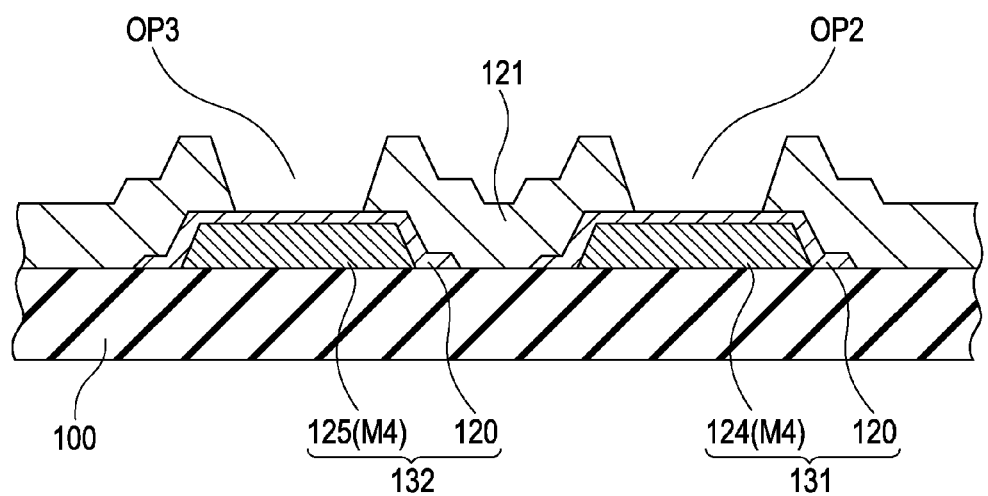
FIG. 3 is a schematic sectional view of the photoelectric conversion apparatus and the radiation detection apparatus according to the first embodiment.
Figure 6:
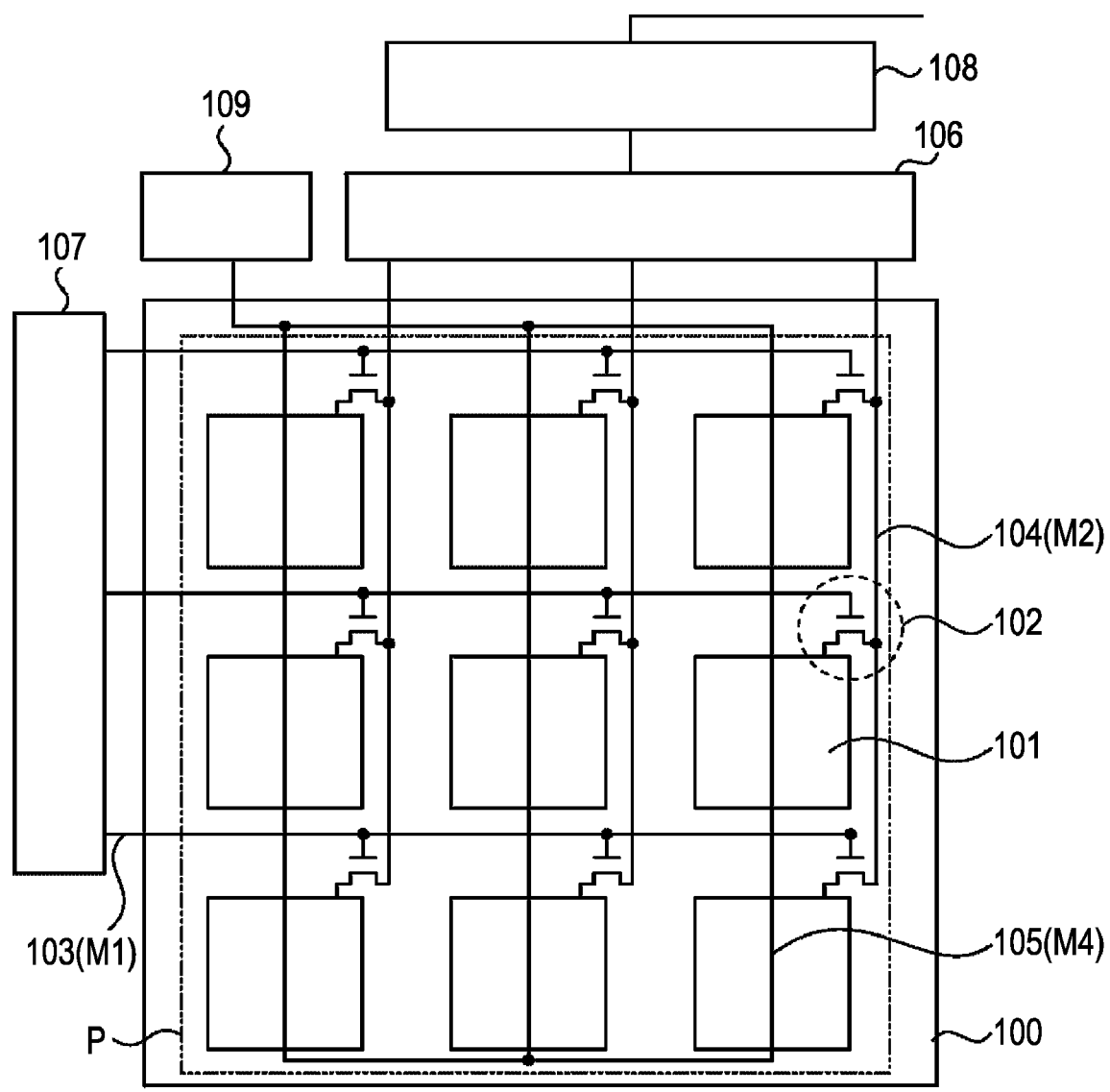
FIG. 6 is a schematic circuit diagram illustrating a conventional photoelectric conversion apparatus and radiation detection apparatus.
Figure 7:
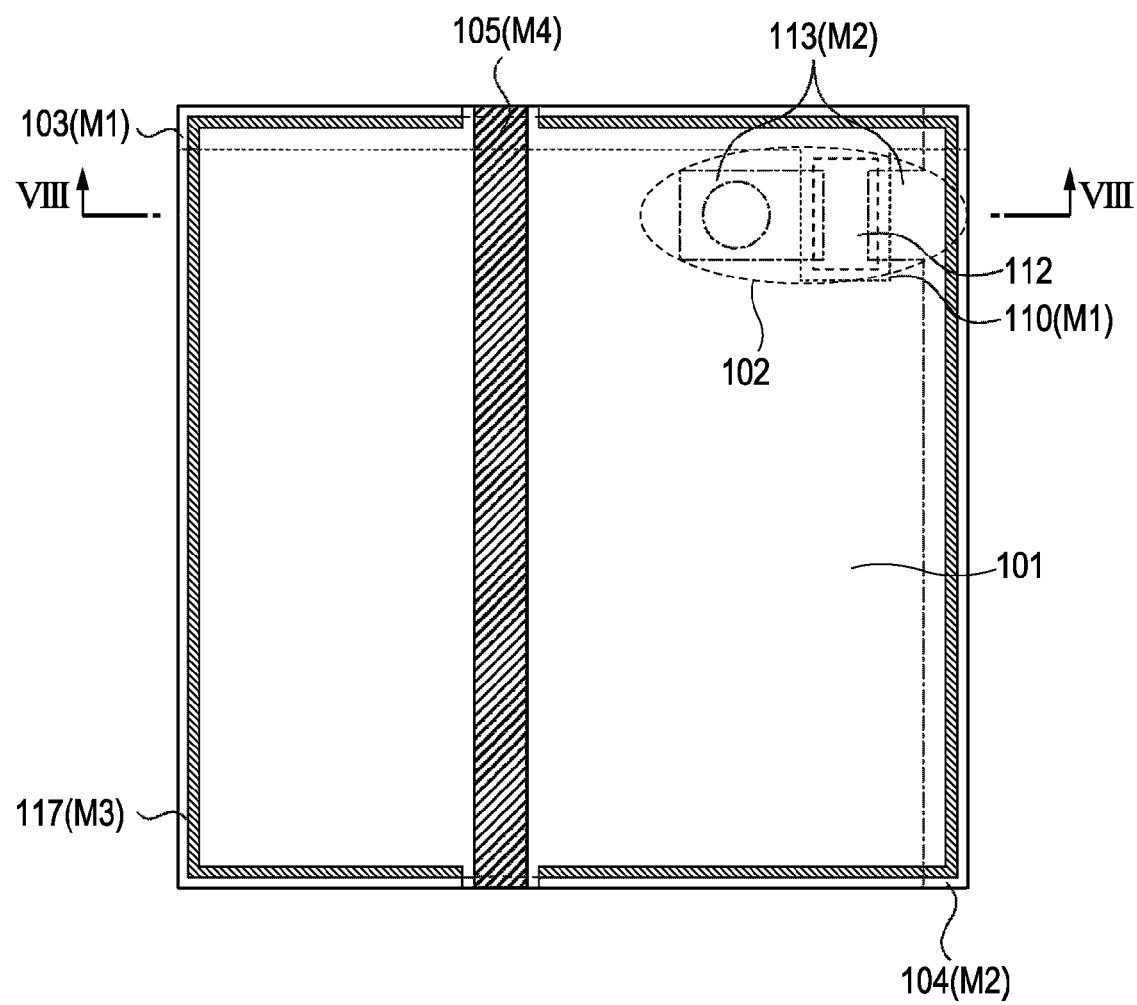
FIG. 7 is a schematic plan view illustrating a single pixel in the conventional photoelectric conversion apparatus and radiation detection apparatus.
Figure 8:
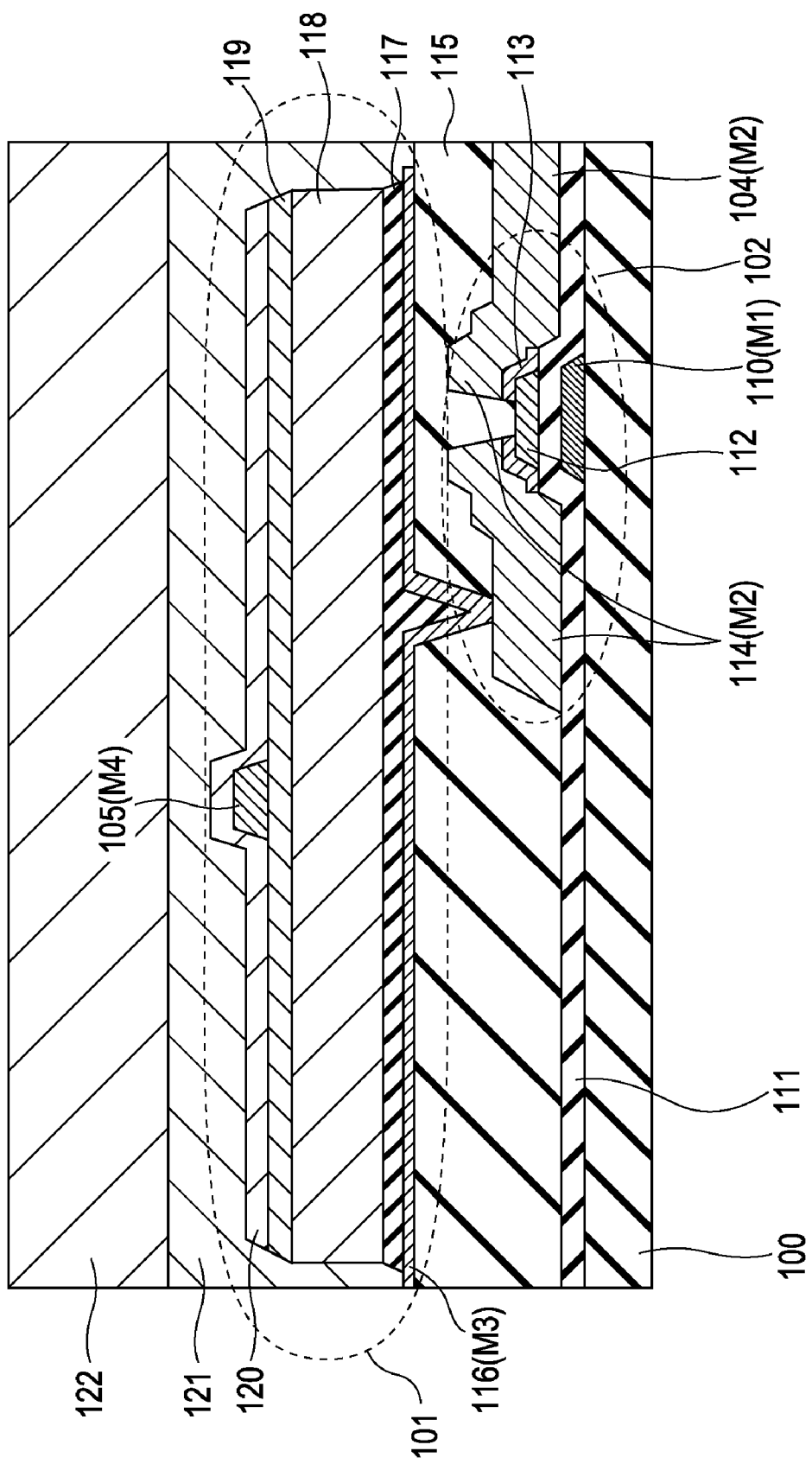
FIG. 8 is a sectional view illustrating the conventional photoelectric conversion apparatus and radiation detection apparatus shown in FIG. 7 taken along line VIII-VIII.

A first exemplary embodiment of the present invention will be described in detail below with reference to FIGS. 1 to 3. FIG. 1 a schematic circuit diagram of a photoelectric conversion apparatus and a radiation detection apparatus according to the first embodiment of the present invention. FIG. 2 is a plan view in which a peripheral region of the photoelectric conversion apparatus and the radiation detection apparatus according to the first embodiment of the present invention is enlarged. FIG. 3 is a schematic cross-sectional view of FIG. 2 taken along line III-III. In FIGS. 1 to 3, components similar to those included in the conventional FPD shown in FIGS. 6 to 8 are denoted by the same reference numerals and detailed explanations thereof are thus omitted.

Referring to FIGS. 1 to 3, the structure includes an insulating substrate 100, photoelectric conversion elements 101 that function as conversion elements, switching elements 102, drive lines 103, signal lines 104, and bias lines 105. The insulating substrate 100 can be a glass substrate, a quartz substrate, a plastic substrate, etc. The photoelectric conversion elements 101 are MIS photosensors made of a-Si and the switching elements 102 are TFTs made of a-Si. Each of the photoelectric conversion elements 101 and the corresponding switching element 102 form a single pixel. The pixels are arranged in a two-dimensional matrix pattern, and a pixel area P is provided accordingly. A plurality of contact holes are arranged in a region C (shown in FIG. 2) outside the pixel area P. As for the region C, it is preferred that the layers are arranged so that the total film thickness may decrease toward terminal elements (e.g., 123, 124, 125 in FIG. 2) from the pixel area P. By such structure, the defects of the lines coupled between the contact hole and the terminal element can be decreased.

The drive lines 103 are connected to gate electrodes 110 (shown in FIG. 4) of the switching elements 102 arranged in a row direction, and are formed of a first metal layer M1, which is the same layer as a layer forming the gate electrodes 110 of the switching elements 102. The signal lines 104 are connected to source or drain electrodes 114 (shown in FIG. 4) of the switching elements 102 arranged in a column direction, and are formed of a second metal layer M2, which is the same layer as a layer forming the source or drain electrodes 114 of the switching elements 102. The bias lines 105 are connected to an upper electrode layer 120 for applying a bias voltage to the photoelectric conversion elements 101. Thus, a sensor upper electrode is provided. The bias lines 105 are formed of a fourth metal layer M4 made of metal, such as Al.

In the first embodiment of the present invention, drive-line leading portions 103a are connected to the drive lines 103 via contact holes 126 in the region C outside the pixel area P. The drive-line leading portions 103a are provided with drive-line terminal elements 123 for providing electrical connection to a drive circuit 107 (shown in FIG. 6). The drive-line leading portions 103a and the drive-line terminal elements 123 are formed of the fourth metal layer M4, which is the same layer as the top metal layer that forms the bias lines 105 in the FPD having a laminated structure. Accordingly, only a protective layer 121 is laminated on the drive-line leading portions 103a. Therefore, a connection area (open area) OP1 for providing electrical connection to the drive circuit 107 can be easily formed. In addition, since the drive-line leading portions 103a and the drive-line terminal elements 123 are formed of the fourth metal layer M4 together with the bias lines 105, similar to the bias lines 105, the surfaces of the drive-line leading portions 103a and the drive-line terminal elements 123 are covered by the upper electrode layer 120. Therefore, corrosion of the fourth metal layer M4 can be prevented at the drive-line terminal elements 123.

In addition, signal-line leading portions 104a are connected to the signal lines 104 via contact holes 127 in the region C outside the pixel area P. The signal-line leading portions 104a are provided with signal-line terminal elements 124 for providing electric connection to a signal-processing circuit 106 (shown in FIG. 6). The signal-line leading portions 104a and the signal-line terminal elements 124 are formed of the fourth metal layer M4, which is the same layer as the top metal layer that forms the bias lines 105 in the FPD having the laminated structure. Accordingly, only the protective layer 121 is laminated on the signal-line terminal elements 124. Therefore, a connection area (open area) OP2 for providing electrical connection to the signal-processing circuit 106 can be easily formed. In addition, since the signal-line leading portions 104a and the signal-line terminal elements 124 are formed of the fourth metal layer M4 together with the bias lines 105, similar to the bias lines 105, the surfaces of the signal-line leading portions 104a and the signal-line terminal elements 124 are covered by the upper electrode layer 120. Therefore, corrosion of the fourth metal layer M4 can be prevented at the signal-line terminal elements 124.

In addition, first bias-line leading portions 105a are connected to the bias lines 105 via contact holes 128 in the region outside the pixel area P. The first bias-line leading portions 105a are formed of the first metal layer M1, which is the same layer as a bottom metal layer that forms the drive lines 103 in the FPD having the laminated structure. In addition, the first bias-line leading portions 105a are also connected to a second bias-line leading portion 105b via a contact hole 129. The second bias-line leading portion 105b is provided with a bias-line terminal element 125 for providing electrical connection to a bias power source 109 (shown in FIG. 6). The second bias-line leading portion 105b and the bias-line terminal element 125 are formed of the fourth metal layer M4, which is the same layer as the top metal layer that forms the bias lines 105 in the FPD having the laminated structure. Accordingly, only the protective layer 121 is laminated on the bias-line terminal element 125. Therefore, a connection area (open area) OP3 for providing electrical connection to the bias power source 109 can be easily formed. In addition, since the second bias-line leading portion 105b and the bias-line terminal element 125 are formed of the fourth metal layer M4 together with the bias lines 105, similar to the bias lines 105, the surfaces of the second bias-line leading portion 105b and the bias-line terminal element 125 are covered by the upper electrode layer 120. Therefore, corrosion of the fourth metal layer M4 can be prevented at the bias-line terminal element 125.

In the present embodiment, the terminal elements 123 to 125 are formed of the fourth metal layer M4, i.e., the top metal layer in the FPD, together with the bias lines 105. The terminal elements 123 to 125 can also be formed of the first metal layer M1 or the second metal layer M2. However, the terminal elements 123 to 125 can be formed of the fourth metal layer M4. After the first metal layer M1 forming the drive lines 103 is provided, a first insulating layer 111, a first semiconductor layer 112, a first impurity semiconductor layer 113, the second metal layer M2, an interlayer insulating layer 115, a third metal layer M3, a second insulating layer 117, a second semiconductor layer 118, a second impurity semiconductor layer 119, the fourth metal layer M4, the upper electrode layer 120, the protective layer 121, and a phosphor layer (wavelength converter) 122 which converting the radiation into a visible light are laminated on the first metal layer M1. Therefore, the first metal layer M1 can be damaged due to heating, etching, etc., performed during the process of forming the above-mentioned layers. In addition, after the second metal layer M2 forming the signal lines 104 is provided, the interlayer insulating layer 115, the third metal layer M3, the second insulating layer 117, the second semiconductor layer 118, the second impurity semiconductor layer 119, the fourth metal layer M4, the upper electrode layer 120, and the protective layer 121 are laminated on the second metal layer M2. Therefore, the second metal layer M2 can be damaged due to heating, etching, etc., performed during the process of forming the above-mentioned layers. In addition, as the metal layers become increasingly damaged, contamination by moisture and impurities in the atmosphere and corrosion due to the contamination can more easily occur. For example, when the metal surfaces are oxidized in the heating process, wettability of the surfaces is increased and the surfaces cannot be easily dried. As a result, washing using chemical liquid or the like may be insufficient, which can lead to corrosion. In addition, there is a problem that the electric resistance is increased due to the surface oxidization of the metal layers in the heating process. In addition, surface damages of the metal layers due to etching and residue of etching material may also lead to corrosion. In the present embodiment, only the protective layer 121 is provided on the fourth metal layer M4 that forms the terminal elements 123 to 125. Therefore, the fourth metal layer M4 is damaged only during the process of forming the protective layer 121 and the process of forming the connection areas (open areas) OP1 to OP3 for the terminal elements 123 to 125, respectively. As a result, the fourth metal layer M4 is less damaged compared to the other metal layers M1 to M3. Therefore, the fourth metal layer M4 will have good surface condition and is less likely to be effected by contamination by moisture and impurities in the atmosphere and corrosion due to the contamination.

Next, the cross-sectional structure of the terminal elements will be explained below with reference to FIG. 3, where the signal-line terminal element 124 and the bias-line terminal element 125 are illustrated as examples of terminal elements. In one embodiment, the upper electrode layer 120 is formed of a transparent conductive layer constructed of alloy oxide, such as ITO. In FIG. 3, the upper electrode layer 120 is provided so as to cover the top and side faces of the signal-line terminal element 124 on the insulating substrate 100, and a signal-line terminal 131 is disposed accordingly. Then, the protective layer 121 and the connection area (open area) OP2 are disposed such that at least the contact interface between the signal-line terminal 131 and the insulating substrate 100 (edges of the signal-line terminal 131) is covered. Similarly, the upper electrode layer 120 is disposed so as to cover the top and side faces of the bias-line terminal element 125 on the insulating substrate 100, and a bias-line terminal 132 is disposed accordingly. Then, the protective layer 121 and the connection area (open area) OP3 are disposed such that at least the contact interface between the bias-line terminal 132 and the insulating substrate 100 (edges of the bias-line terminal 132) is covered. Although not shown in FIG. 3, the upper electrode layer 120 is also disposed so as to cover the top and side faces of each drive-line terminal element 123, and a drive-line terminal (not shown) is disposed accordingly. In addition, the protective layer 121 and the connection area (open area) OP1 are disposed such that at least the contact interface between the drive-line terminal and the insulating substrate 100 (edges of the drive-line terminal) is covered. Due to the above-described structure, contamination by moisture and impurities from the side faces of the terminal elements 123 to 125 and interfaces between the insulating substrate 100 and the terminals (drive-line terminals, signal-line terminals 131, and bias-line terminals 132) can be reliably prevented. In the present embodiment, the terminal elements 123 to 125 are covered by the upper electrode layer 120. However, the present invention is not limited to this, and the protective layer 121 and the connection areas OP1 to OP3 may also be disposed such that side faces of the terminal elements 123 to 125 and the contact interfaces with respect to the insulating substrate 100 are covered by the protective layer 121. However, when the upper electrode layer 120, which is, in one embodiment, a transparent conductive layer constructed of alloy oxide that has a higher moisture resistance than that of a metal material, is used to cover the terminal elements 123 to 125 constructed of metal layers, contamination by moisture and impurities in the atmosphere can be more reliably prevented.

In addition, in the present embodiment, the protective layer 121 is not removed in areas between the adjacent terminal elements but is disposed so as to cover the side faces of terminal elements and the contact interfaces with respect to the insulating substrate 100. In FIG. 3, the protective layer 121 is not removed in the area between the signal-line terminal 131 and the bias-line terminal 132 but is disposed so as to cover the side faces of the terminals 131 and 132 and the contact interfaces with respect to the insulating substrate 100. Thus, the protective layer 121 is disposed so as to cover the areas between the adjacent terminal elements. According to such a structure, even when conductive adhesive for providing connection to ICs having external circuits flows into the areas between the adjacent terminal elements, short circuit can be prevented. Therefore, the terminal elements can be reliably insulated from each other and reduction in reliability and manufacturing yield can be prevented.

In the above-described structure, the protective layer 121 is provided so as to cover the contact interfaces between the insulating substrate 100 and the terminals (edges of the drive-line terminals, the signal-line terminals 131, and the bias-line terminals 132). However, the present invention is not limited to this, and the contact interfaces (edges) may also be covered with a protective layer that is provided separately from the protective layer 121 to cover at least the lines or the terminals (drive-line terminals, signal-line terminals 131, and bias-line terminals 132).

Figure 4:
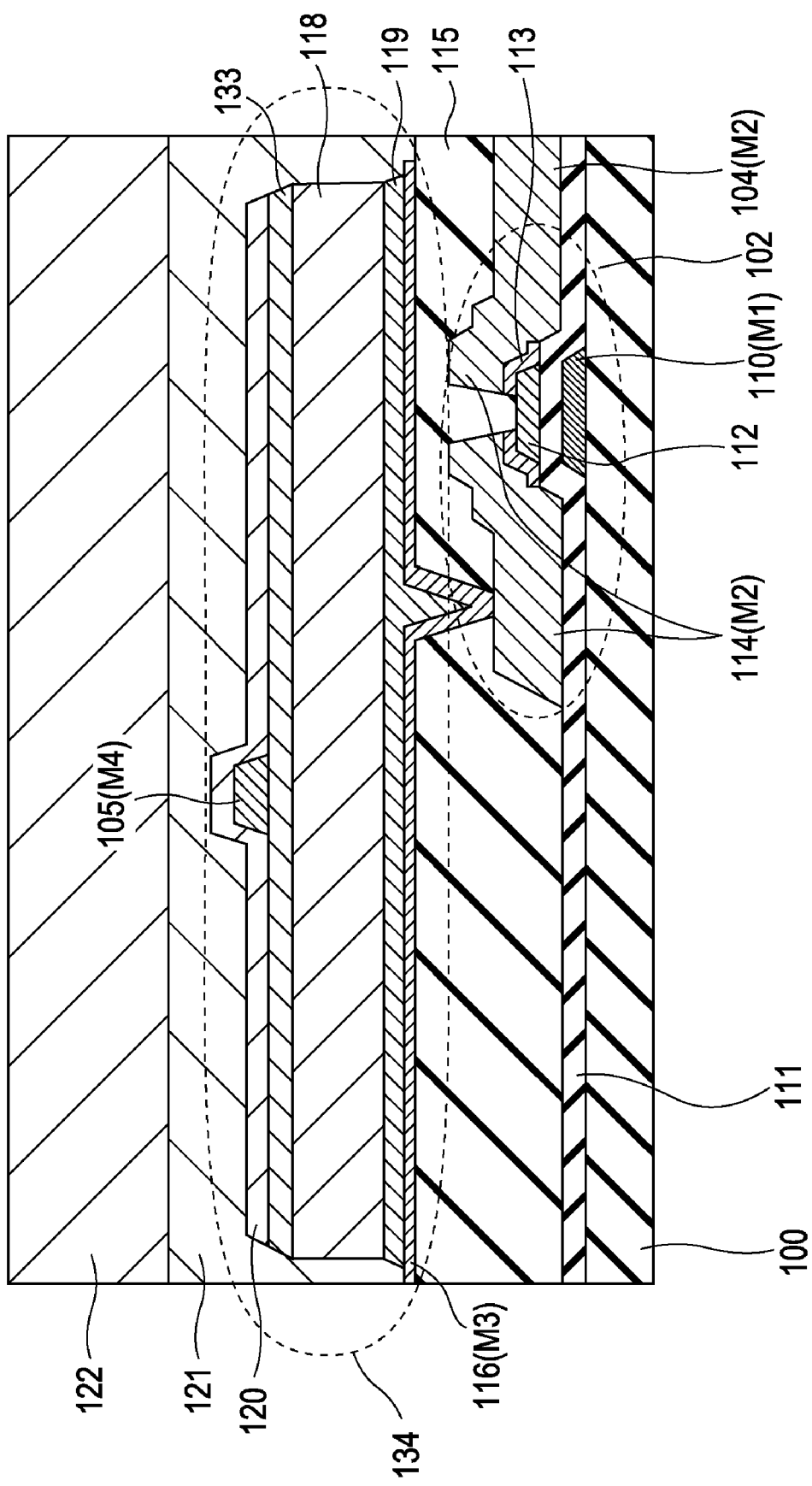
FIG. 4 is a sectional view of a photoelectric conversion apparatus and a radiation detection apparatus according to an embodiment of the present invention.

In the present embodiment, the MIS-FPD using MIS photosensors as the photoelectric conversion elements 101 and having a laminated structure is described as an example. However, as shown in FIG. 4, an embodiment of the present invention may also be applied to a PIN-FPD using PIN photodiodes 134 as photoelectric conversion elements. In FIG. 4, reference numeral 133 denotes a third impurity semiconductor layer into which impurities of the conductivity that is different from that of a second impurity semiconductor layer 119 are implanted. In the PIN photodiodes 134, the second impurity semiconductor layer 119 can be an n-type a-Si layer and the third impurity semiconductor layer 133 can be a P-type a-Si layer. In addition, in the present embodiment, gap-etching TFTs are used as the switching elements 102. However, the present invention is not limited to this, and gap-stopper TFTs and planer TFTs used in poly-Si TFTs may also be used. Thus, various modifications can be made within the scope of the present invention as long as the combination of the switching elements 102 and the photoelectric conversion elements 101 is provided and at least three metal layers for the drive lines 103, the signal lines 104, and the bias lines 105 are used. In addition, in the present embodiment, the signal lines 104 and the source or drain electrodes 114 are formed of the second metal layer M2, and a sensor lower electrode 116 are formed of the third metal layer M3, which is different form the second metal layer M2. However, the present invention is not limited to this, and the signal lines 104, the source or drain electrodes 114, and the sensor lower electrode (third metal layer) 116 may be formed of the same metal layer. However, in such a case, the signal lines 104 cannot be arranged so as to overlap the sensor lower electrode. In addition, the photoelectric conversion elements and the switching elements cannot be arranged completely on top of one another. Therefore, the opening rate of the FPD is reduced compared to the case in which different metal layers are used. In addition, in the present embodiment, the FPD including the MIS photosensors 101 using the second semiconductor layer 118 made of a-Si or the PIN photodiodes as the conversion elements is described. However, the present invention is not limited to this, and FPDs including conversion elements using semiconductor layers made of a-Se or CdTe and directly converting radiation into electric charges may also be used.

Second Exemplary Embodiment

Figure 5:
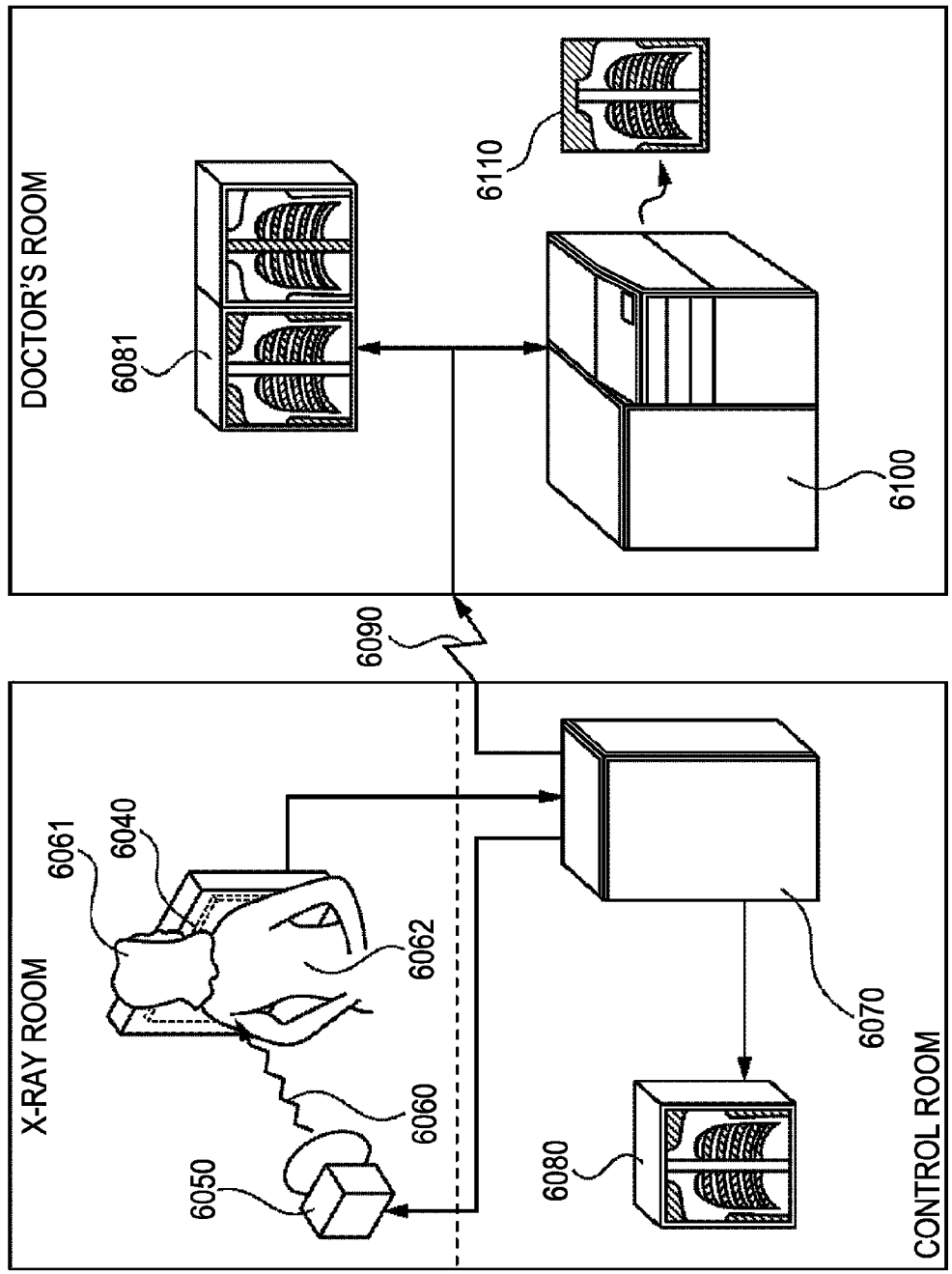
FIG. 5 is a diagram illustrating a radiation detection system to which the radiation detection apparatus according to embodiments the present invention can be applied.

FIG. 5 is a diagram showing an X-ray diagnosis system to which the FPD radiation detection apparatus according to an embodiment of the present invention is applied.

X-rays 6060 generated by an X-ray tube 6050 pass through a chest area 6062 of a patient or subject 6061 and are incident on a radiation detection apparatus 6040 having a scintillator (fluorescent material) in an upper region. The incident X-rays include information of the inside of the patient's body. The scintillator generates light in accordance with the incident X-rays, and the generated light is subjected to photoelectric conversion so that electrical information is obtained. The thus obtained information is digitized and subjected to image processing by an image processor 6070 that functions as a signal processing unit, and is then displayed by a display 6080 that functions as a display unit in a control room.

In addition, the image processor 6070 can transmit the electrical signals output from the image sensor 6040 to a remote location via a transmission processing unit, such as a telephone line 6090, so that the information can also be displayed on a display unit (display) 6081 at a different location, such as a doctor's room. In addition, the electric signals output from the image sensor 6040 may also be stored in a storing unit, such as an optical disc, so that a doctor at a remote location can diagnose the information using the storing unit. In addition, the information can also be recorded on a film 6110 by a film processor 6100 that functions as a recording unit.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-201603 filed Jul. 11, 2005 and No. 2006-181890 filed Jun. 30, 2006, which are hereby incorporated by reference herein in their entirety.

What is claimed is:

1. A conversion apparatus comprising:
    pixels including switching elements disposed over an insulating substrate and conversion elements disposed over the switching elements and coupled to the switching elements;
    lines coupled to the pixels and having terminal elements to provide a connection to an external circuit;
    a transparent conductive layer covering surfaces of the terminal elements; and
    a protective layer covering edges of the terminal elements and having openings,
    wherein the lines include bias lines disposed over the conversion elements and coupled to an external power source circuit for applying a bias voltage to the conversion elements, and
    wherein the terminal elements are formed of a metal layer that is formed over the conversion elements.

2. The conversion apparatus according to claim 1, wherein the bias lines are disposed in the metal layer.

3. The conversion apparatus according to claim 1, wherein the protective layer is disposed on the transparent conductive layer and covers edges of the transparent conductive layer.

4. The conversion apparatus according to claim 1, wherein the protective layer covers the pixels.

5. The conversion apparatus according to claim 1, wherein the terminal elements are disposed on the substrate and the protective layer covers side faces of the terminal elements.

6. The conversion apparatus according to claim 1, wherein the terminal elements are disposed on the substrate and the transparent conductive layer covers side faces of the terminal elements.

7. The conversion apparatus according to claim 1, wherein the protective layer is provided so as to cover at least opposing edges of adjacent terminal elements in areas between the adjacent terminal elements.

8. A radiation detection apparatus comprising:
    pixels including switching elements coupled to conversion elements;
    terminal elements to provide connections to an external circuit;
    conductive lines coupled between the pixels and the terminal elements, the lines including bias lines coupled between the conversion elements and an external power source circuit to apply a bias voltage to the conversion elements;
    and a wavelength converter disposed over the conversion elements for converting incident radiation into visible light,
    wherein the terminal elements are formed of a layer that is formed over a layer including the conversion elements.

9. The radiation detection apparatus of claim 8, wherein the terminal elements and the bias lines are disposed in the same metal layer.

10. The radiation detection apparatus according to claim 8,
    wherein the switching elements are disposed over an insulating substrate;
    wherein the conversion elements are disposed over the switching elements; and
    wherein the bias lines are disposed over the conversion elements.

11. The radiation detection apparatus according to claim 10, further comprising:
    a transparent conductive layer covering surfaces of the terminal elements;
    a protective layer disposed on the transparent conductive layer so as to cover at least opposing side faces of at least two adjacent terminal elements.

12. A radiation detection system according to claim 8, further comprising:
    a signal processing unit configured to process signals from the conversion elements;
    a recording unit configured to record signals from the signal processing unit;

a display unit configured to display the signals from the signal processing unit;

a transmission processing unit configured to transmit the signals from the signal processing unit; and a radiation source for generating radiation.

13. An apparatus comprising:

pixels including switching elements coupled to conversion elements;

terminal elements to provide a connection to an external circuit; and conductive lines coupled between the pixels and the terminal elements, the conductive lines including bias lines coupled between the conversion elements and an external power source circuit to apply a bias voltage to the conversion elements, wherein the terminal elements are formed of a layer that is formed over a layer including the conversion elements.

14. The apparatus of claim 13, wherein the terminal elements and the bias lines are disposed in the same metal layer.

15. The apparatus according to claim 14, wherein the switching elements are disposed over an insulating substrate;

wherein the conversion elements are disposed over the switching elements; and wherein the bias lines are disposed over the conversion elements.

16. The apparatus according to claim 15, further comprising:

a transparent conductive layer covering surfaces of the terminal elements;

a protective layer disposed on the transparent conductive layer so as to cover at least opposing side faces of at least two adjacent terminal elements.

* * * * *